United States Patent [19]
Lin et al.

[11] Patent Number: 6,088,273
[45] Date of Patent: Jul. 11, 2000

[54] METHOD AND CIRCUIT FOR MEASURING THE READ OPERATION DELAY ON DRAM BIT LINES

[75] Inventors: Hongchin Lin; Shyh-Chyi Wong; Chien-Zhi Chen; Chia-Hsiang Sha, all of Hsinchu, Taiwan

[73] Assignee: Winbond Electronics Corp., Hsinchu, Taiwan

[21] Appl. No.: 09/312,930

[22] Filed: May 17, 1999

[51] Int. Cl.[7] .................................................. G11C 7/00
[52] U.S. Cl. .................... 365/194; 365/201; 365/230.06; 365/210
[58] Field of Search .............................. 365/194, 230.06, 365/201, 149, 210

[56] References Cited

U.S. PATENT DOCUMENTS

| | | | |
|---|---|---|---|
| 5,901,096 | 5/1999 | Inokuchi et al. | 365/230.06 |
| 5,943,288 | 8/1999 | Jiang | 365/230.06 |
| 5,946,243 | 8/1999 | Sim | 365/189.11 |

*Primary Examiner*—Son T. Dinh
*Attorney, Agent, or Firm*—Dellett and Walters

[57] ABSTRACT

A circuit and a method for measuring the read operation delay on DRAM bit lines are disclosed. The circuit comprises a plurality of circuit blocks connected in series, each having a 1-bit DRAM cell. The output of the DRAM cell in each circuit block is connected to the word line of the DRAM cell of the next circuit block through inverters, so the read operation in the DRAM cell of the next circuit block is triggered. The total delay between the word line at the first circuit block and the output of the last circuit block can be measured on the oscilloscope. The delay for every 1-bit DRAM cell is equal to the total delay divided by the number of circuit blocks.

10 Claims, 9 Drawing Sheets

METHOD AND CIRCUIT FOR MEASURING THE READ OPERATION DELAY ON DRAM BIT LINES

BACKGROUND OF THE INVENTION

1. Field of the Invention

The present invention relates to the measurement of DRAM delay, more particular, to a method and a DRAM circuit for measuring the read operation delay on DRAM bit lines.

2. Description of Related Art

As the semiconductor technology migrates to deep-submicron and nanometer dimensions, as well as sub-nano second switching, VLSI (Very Large Scale Integrated circuits) interconnects have become one of the important limiting factors of modern high-speed and high-density circuit performance. Since the polysilicon/metal wires of integrated circuit are getting narrower, and the number of cells on the bit line of the integrated circuit are increasing, the interconnect RC delay may play a very significant role in circuit performance.

Figure 6:
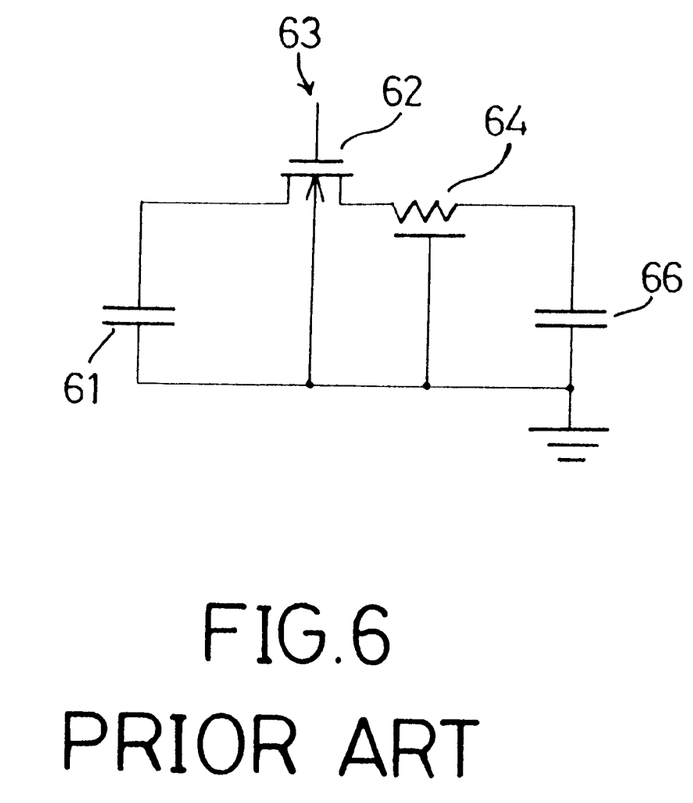
FIG. 6 shows an equivalent circuit of a conventional DRAM cell.

FIG. 6 shows a DRAM (Dynamic Random Access Memory) cell with a long polysilicon bit line (64). A bit is stored in a data capacitor (61). A word line (63) is provided to control the switching of the N-MOSFET (62). When the data bit is read out, the signal of the data bit needs to go through the polysilicon bit line (64) and reaches a sense amplifier. Since the inputs of a sense amplifier are the gates of MOSFETs, the equivalent circuit of the sense amplifier is a load capacitor (66). Consequently, the polysilicon bit line (64) consists of distributed RC and many junction capacitors from the sources of the MOSFETs, which are connected on the polysilicon bit line (64).

Currently, most of the analyses or measurement techniques are concentrated on either gates or RC distributed transmission lines. Recently, the measurement technique for CMOS SRAM (Static Random Access Memory) with interconnect propagation delay has been proposed, in which the delay is more than 10 nano-seconds, so it can be measured directly. Since the delay to be measured will be less than 1 nano-second, direct measurement is getting more difficult. Furthermore, the charging mechanisms are different for SRAMs and DRAMs. For read operations, the former uses inverters as drivers, and the later employs a data capacitor through an N-MOSFET to charge the bit line. The voltage variation for DRAM on the bit line is much smaller, so direct measurement is quite difficult. The proposed method will facilitate the measurement of the delay.

The measurement of the time required for the data stored in the capacitor (61) to be read at $V_0$ is difficult due to the short delay time and small voltage variation. It is barely possible to observe the waveform directly on an oscilloscope. In addition, if the signal of the data is directly measured, the capacitance on the pad for measuring may be much larger than the total capacitance on the bit line. Therefore, a novel circuit and method are required to measure the short delay time of a DRAM.

SUMMARY OF THE INVENTION

One objective of the present invention is to provide a circuit for measuring the delay of read operations on DRAM bit lines directly on an oscilloscope.

Another objective of the present invention is to provide a method for measuring the delay of read operations on DRAM bit lines by applying suitable signals to the aforesaid circuit.

To achieve these objectives, the present invention provides a circuit for measuring the delay of read operations on DRAM bit lines, which comprises a plurality of circuit blocks connected in series, each having a 1-bit DRAM cell. The output of the DRAM cell in each circuit block is connected to the word line of the DRAM cell of the next circuit block through inverters, so the read operation in the DRAM cell of the next circuit block is triggered. To measure the delay time for a DRAM cell, a square wave is applied to the word line of the first circuit block and a delayed square wave is obtained at the output of the last circuit block. The total delay between the word line at the first circuit block and the output of the last circuit block can be measured on the oscilloscope. The delay for every 1-bit DRAM cell is equal to the total delay divided by the number of circuit blocks.

Other objects, advantages, and novel features of the invention will become more apparent from the following detailed description when taken in conjunction with the accompanying drawings.

DETAILED DESCRIPTION OF PREFERRED EMBODIMENT

Figure 1:
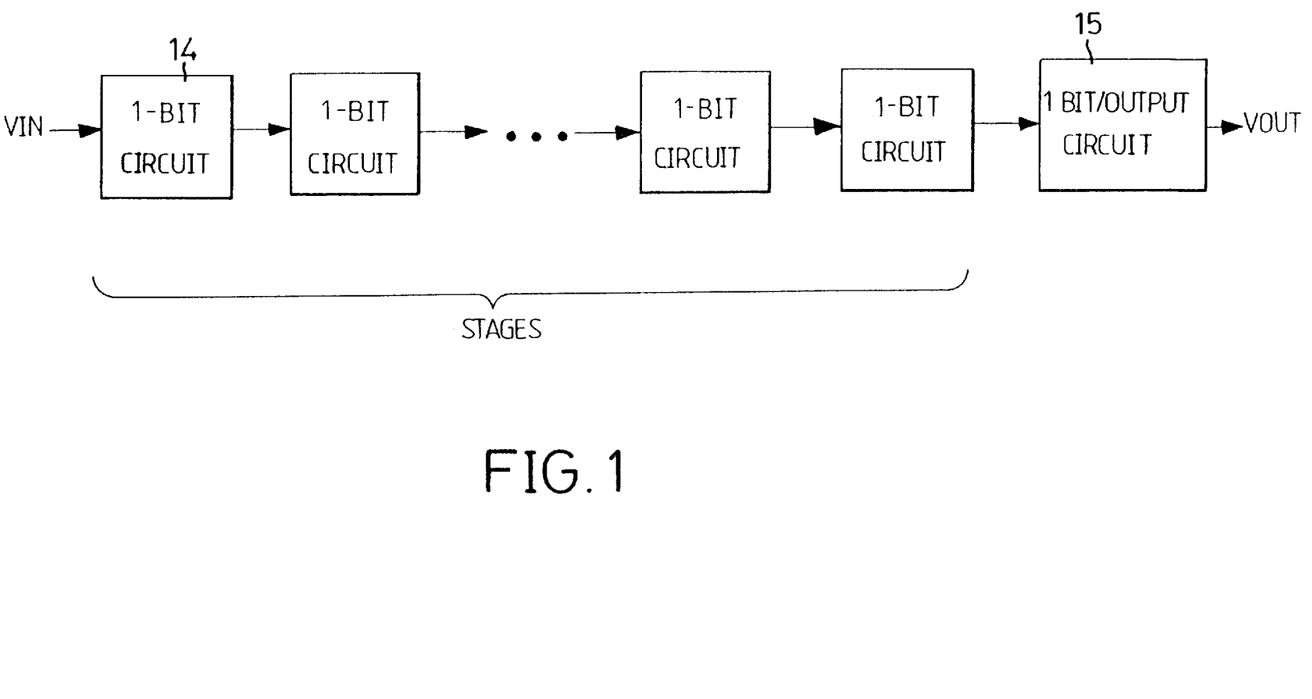
FIG. 1 is a block diagram of the circuit for measuring the read operation delay on DRAM bit lines in accordance with the present invention.
Figure 2A:
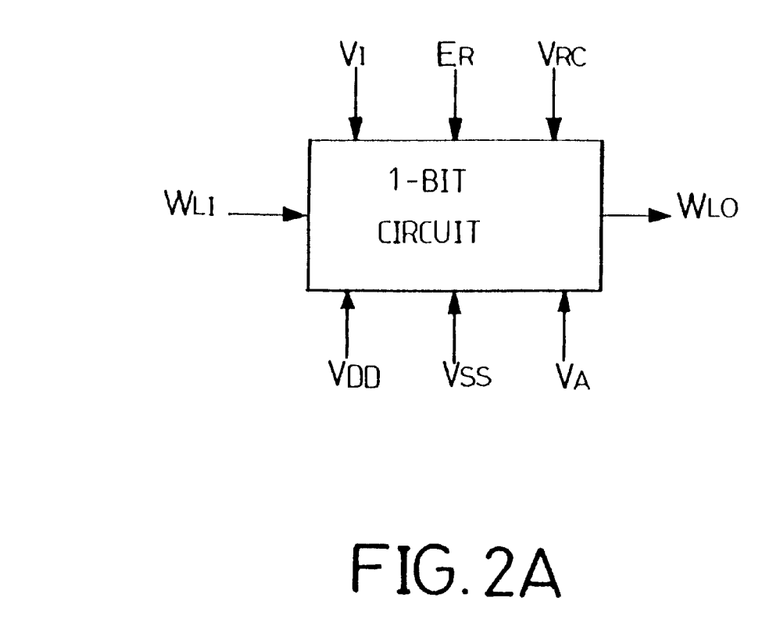
FIG. 2A illustrates the signals of a 1-bit circuit block of the circuit in accordance with the present invention.
Figure 2B:
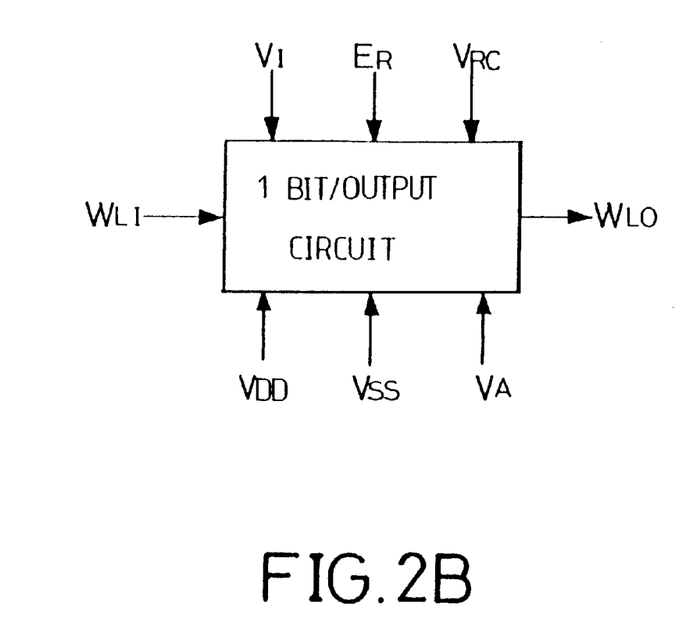
FIG. 2B illustrates the signals of a 1-bit/output circuit block of the circuit in accordance with the present invention.

The block diagram of the circuit for 1-bit DRAM cell delay measurement is shown in FIG. 1, which consists of nine 1-bit circuit blocks (14) and one 1-bit/output circuit block (15) connected in series. Every 1-bit circuit block (14) and the 1-bit/output circuit block (15) have seven inputs $V_I'$ $E_R'$ $V_{RC}'$ Vdd' Vss' $V_A'$ $W_{LI}$ and an output $W_{LO}$ as shown in FIGS. 2A and 2B. The detailed circuits of the 1-bit circuit block (14) and the 1-bit/output circuit block (15) are given in FIG. 3 and FIG. 4, respectively. These two circuits are quite similar except for the inverters at the output of each circuit. Referring to FIG. 2A and 2B again, the 6 input terminals at the top and bottom of both circuit blocks shown in FIG. 2 are the same, which are not shown in FIG. 1. The output terminal $W_{LO}$ of each circuit block is connected to the input terminal $W_{LI}$ of the next block. In this manner, nine 1-bit circuit blocks (14) and one 1-bit/output circuit block (15) are connected in series as illustrated in FIG. 1. $W_{LI}$ of the first circuit block is renamed as Vin and $W_{LO}$ of the last circuit block is renamed as Vout. When a square wave is applied to Vin, the response is generated at Vout. The delay time between these two signals can be measured by an oscilloscope. If there are 10 circuit blocks in the circuit as shown in FIG. 1, the delay time for a 1-bit DRAM cell is approximately 1/10 of the total delay time.

Figure 3:
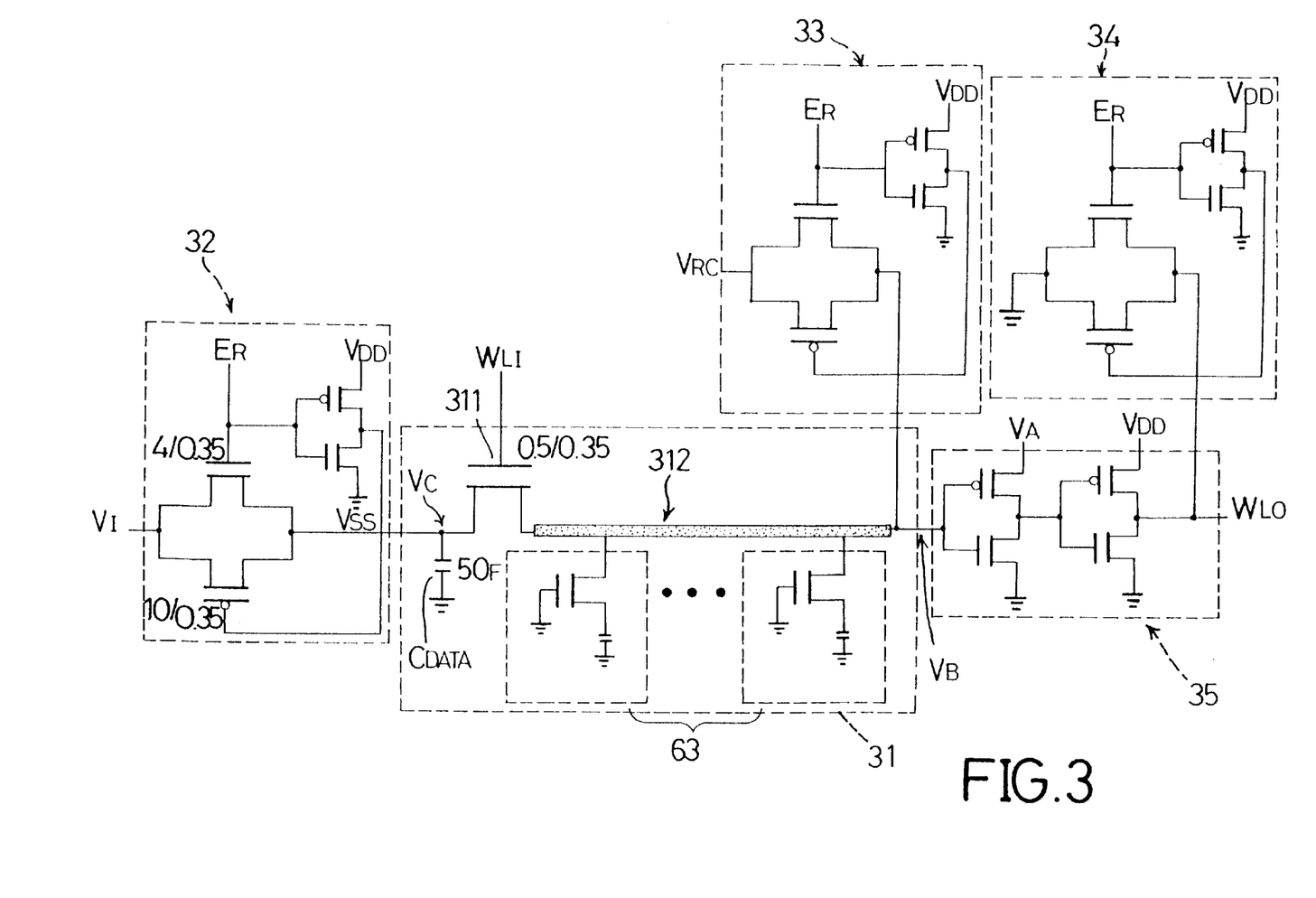
FIG. 3 is a detailed circuit diagram for the 1-bit circuit block.
Figure 4:
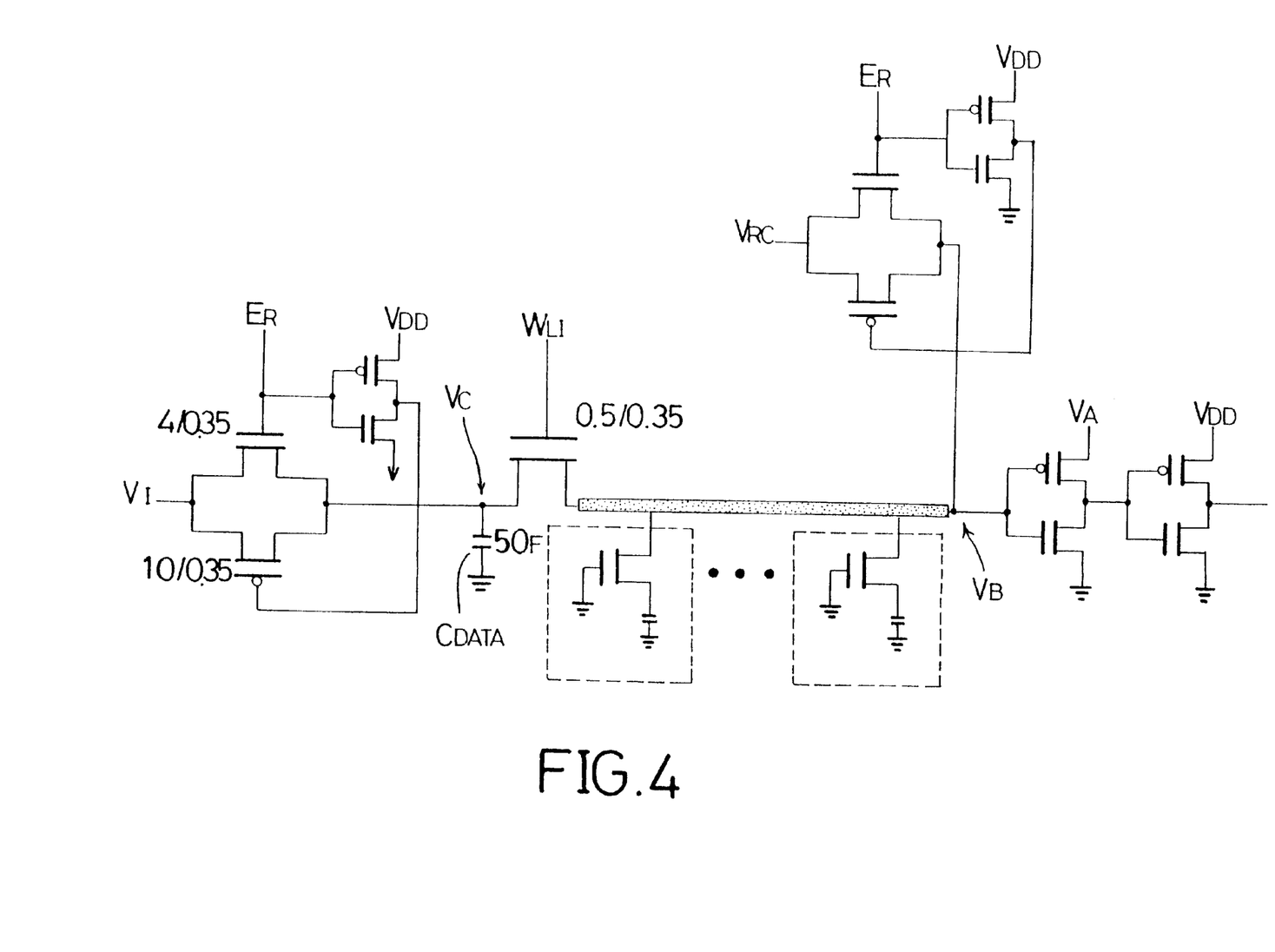
FIG. 4 is a detailed circuit diagram for the 1-bit/output circuit block.

FIG. 3 shows the detailed structure of a 1-bit circuit block (14), which comprises a 1-bit DRAM cell (31), three transmission gates (32, 33, 34) and an inverter pair (35). The 1-bit DRAM cell (31) has a data capacitor ($C_{data}$) connected to an end of a polysilicon line (312) via a NMOS switch transistor (311). The polysilicon line (312) is further connected with 63 dummy DRAM cells. The on/off operation of the NMOS transistor (311) is controlled by the $W_{LI}$ terminal of the 1-bit circuit block (14). The output of the transmission gate (32) is connected to the data capacitor ($C_{data}$) and the input thereof is the $V_I$ terminal of the 1-bit circuit block (14). The transmission gate (32) is controlled by the $E_R$ terminal of the 1-bit circuit block (14) for charging the data capacitor ($C_{data}$). The output of the transmission gate (33) is connected to the polysilicon bit line (312). The transmission gate (33) is also controlled by the $E_R$ terminal of the 1-bit circuit block (14) for charging the polysilicon line (312). The input of the inverter pair (35) is connected to the other end of the polysilicon bit line (312) and the output thereof is the $W_{LO}$ terminal of the 1-bit circuit block (14). The input of the transmission gate (34) is connected to ground and the output thereof is connected to the output of the inverter pair (35). The transmission gate (34) is also controlled by the $E_R$ terminal of the 1-bit circuit block (14). Moreover, FIG. 4 shows the detailed structure of the 1-bit/output circuit block (15) which is similar to that of the 1-bit circuit block (14) as described above except that the transmission gate (34) is absent.

Referring to In FIG. 3 and 4 again, the input terminals Vdd and Vss are provided with the supplied voltages (Vdd) and grounding levels (Vss). $V_I$ terminal is provided with the initial voltage ($V_I$) to be stored in the data capacitor $C_{data}$ that is assumed to be 50 fF. Vc is the voltage drop across $C_{data}$. $V_{RC}$ terminal is provided with the initial voltage ($V_{RC}$) to be set on the polysilicon bit line (312). Due to the threshold voltage variation of the process, the $V_A$ terminal is provided with a voltage $V_A$ which is an adjustable Vdd of the inverter that is the first one of the two consecutive inverters near the terminal. $W_{LO}$, thereby providing switching voltage for calibration. $E_R$ and $W_{LI}$ terminals are provided with a control signal ($E_R$) and word line signal ($W_{LI}$), respectively. Both $E_R$ and $W_{LI}$ are square waves and are to be explained later. The $W_{LO}$ terminal is used to present the output signal ($W_{LO}$). All the MOS transistors have the same channel length of 0.35 μm. The channel widths of the N-MOSFET's of the DRAM cell are 0.5 μm. The channel widths of the other transistors are 4 μm for NMOS and 10 μm for PMOS. The W/L ratios of some transistors are labeled in FIG. 3 and FIG. 4 as examples. The channel width of the transistor for constituting the inverter pair of the 1-bit/output circuit block (15) can be enlarged to enhance the driving capability of the inverter.

Figure 7:
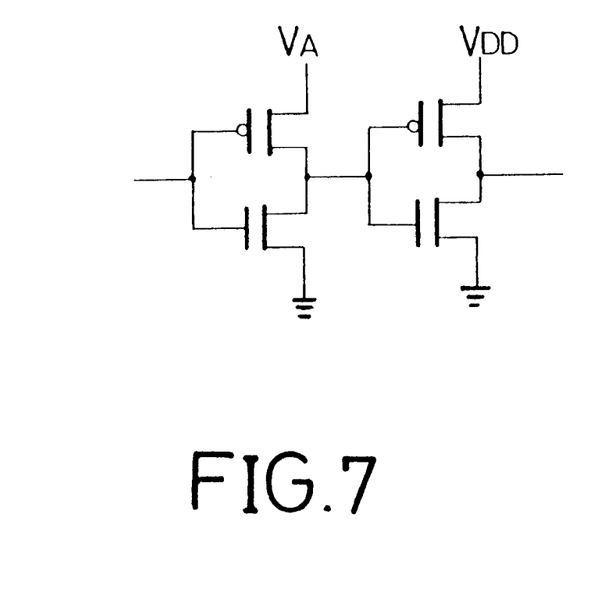
FIG. 7 shows a pair of inverters for calibration of gate threshold.

Before delay measurement, the calibration of the switching voltage of an inverter needs to be performed. That is, a proper $V_A$ has to be found by measuring the input and output of the circuit shown in FIG. 7. It is well known that the switching voltage of the inverter is approximately equal to $\{Vdd+Vtp+Vtn(\beta_n/\beta_p)^{1/2}\}/\{1+(\beta_n/\beta_p)^{1/2}\}$, wherein Vtn and Vtp are NMOS and PMOS threshold voltages, respectively, $\beta_n$ and $\beta_p$ being NMOS and PMOS gain factors, respectively. Due to process fluctuation, the values of Vtn, Vtp, $\beta_n$ and $\beta_p$ may vary, resulting in the switching voltage being different from the nominal value. In order to keep the switching voltage of the inverter constant, Vdd in the above expression is adjusted. To calibrate the gate threshold, DC measurement of FIG. 7 is performed to generate characteristics of Vout vs. Vin. $V_A$ is adjusted to obtain the identical switching voltage for the nominal case.

After $V_A$ is determined, it is applied to the 1-bit DRAM cell delay measurement circuit given in FIG. 1. By applying signals of Vin and $E_R$, the operation of the circuit block is as follows:

(1) Initially, Vin=0, $E_R$=Vdd. At this moment, the voltage $V_I$ is stored in $C_{data}$ and the polysilicon bit line (312) is preset to $V_{RC}$ for the 10 circuit blocks of 1-bit circuit or 1-bit/output circuit. Because the circuit block is suitable for reading logic "1", $V_I$ is set to be the high level of logic "1".

(2) The next event in the sequence is Vin going to Vdd and $E_R$ dropping to 0. Now, all the transmission gates (32, 33, 34) are inactive. $C_{data}$ starts to charge the polysilicon bit line (312) connected with the 63 dummy DRAM cells.

(3) When the voltage is high enough at the far end of the polysilicon bit line (312), which is the input of the inverter pair (35), $W_{LO}$ of this circuit block goes to Vdd and triggers $W_{LI}$ of the next circuit block.

(4) $C_{data}$ of the second circuit block starts to charge the polysilicon bit line. The same sequence in (3) will take place for the second circuit block.

(5) The same sequence in (4) will be repeated for every circuit block. The signals will be propagated until the last one. The total delay between Vin and Vout can be measured on the oscilloscope.

The inverter of the 1-bit/output circuit (15) for connection to the output pad needs to be large enough to drive the pad.

The operation from step (1) through (5) can be repeated. The signals of Vin and $E_R$ become square waves. For ideal square waves, these two signals may be exactly opposite and the time for Vin=Vdd is longer than the total delay, as well as the time for $E_R$=Vdd is longer than the time to preset the initial conditions. However, to avoid the possible timing problems, Vin from 0 to Vdd is better to be slightly later then $E_R$ from Vdd to 0.

Figure 5A:
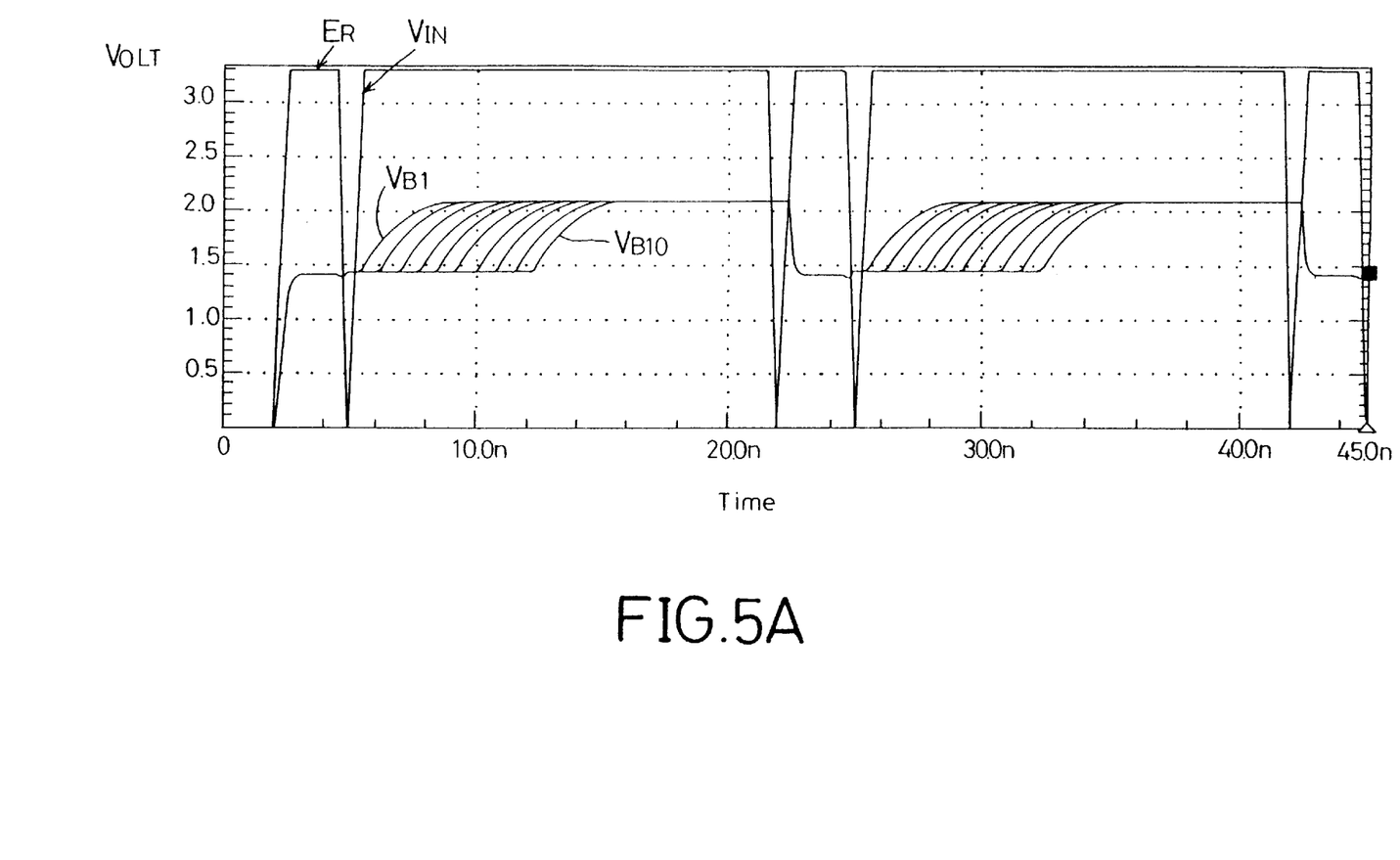
FIG. 5A shows the waveforms from nodes $V_{B1}$ to $V_{B10}$ of the circuit for measuring the read operation delay on DRAM bit lines in accordance with the present invention.
Figure 5B:
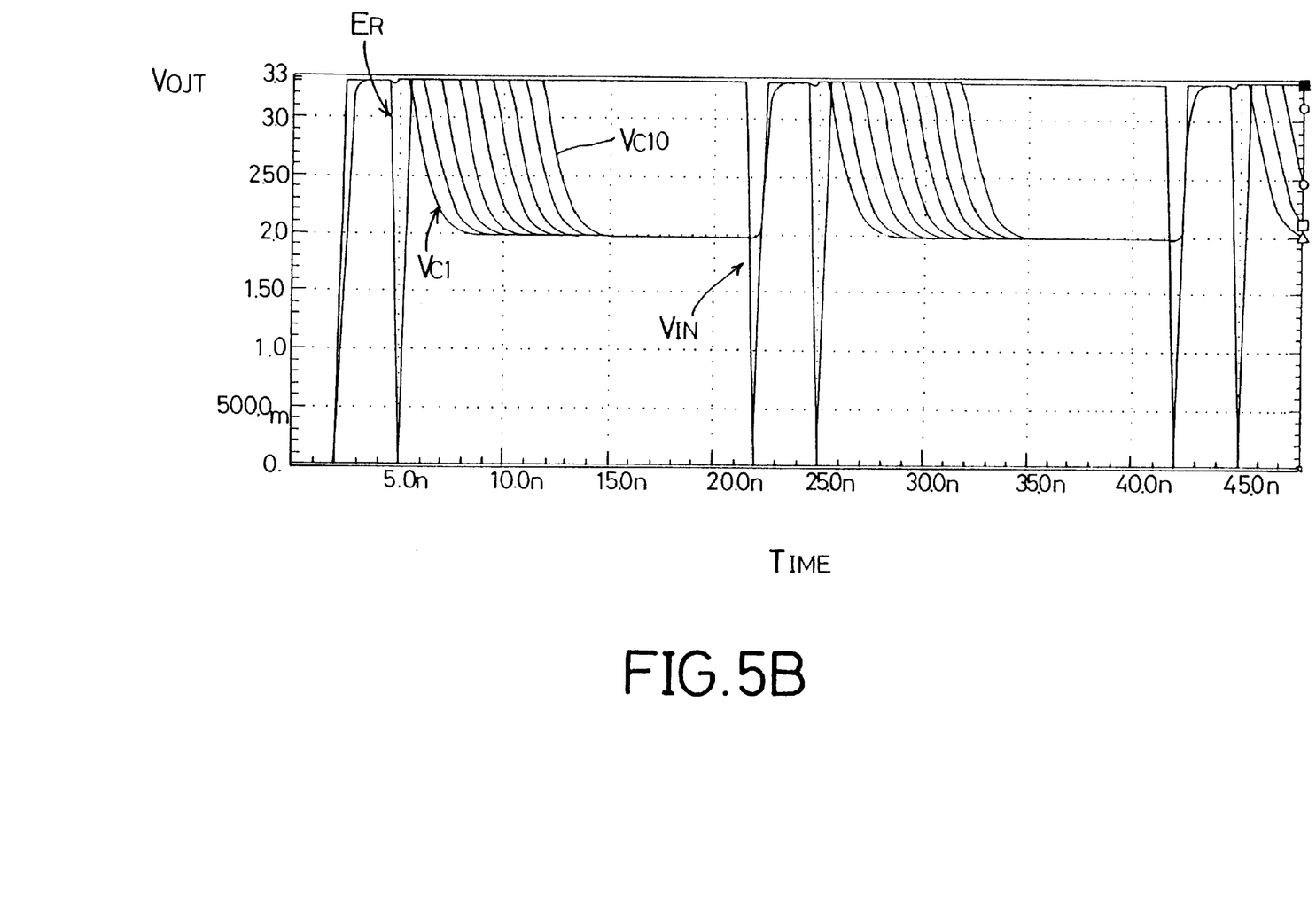
FIG. 5B shows the waveforms from nodes $V_{C1}$ to $V_{C10}$ of the circuit for measuring the read operation delay on DRAM bit lines in accordance with the present invention.
Figure 5C:
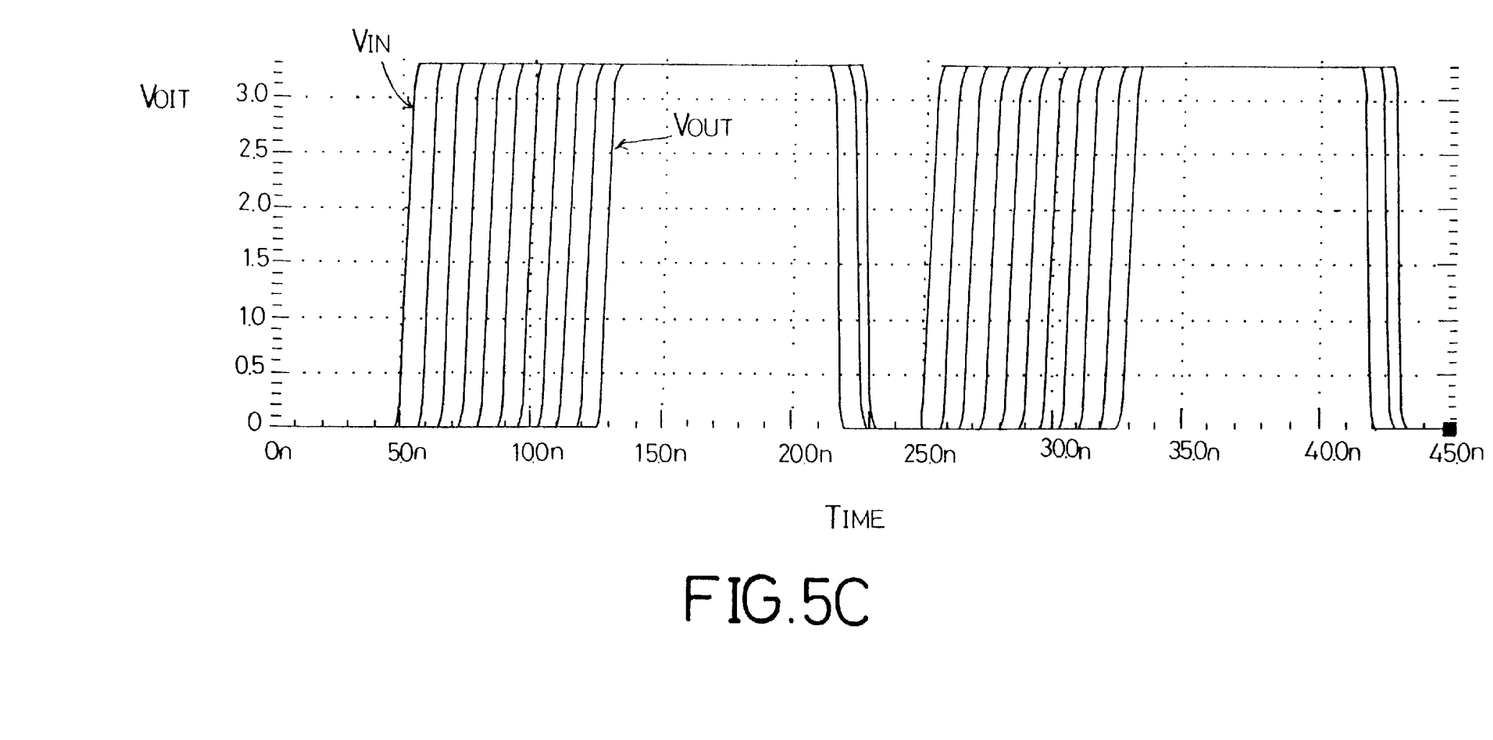
FIG. 5C shows the waveforms for nodes Vin, Vout and $W_{LO}$ of every circuit block in the circuit for measuring the read operation delay on DRAM bit lines in accordance with the present invention.

FIG. 5A, B and C show the waveforms at every circuit block. The waveforms of $E_R$ and Vin are plotted as solid lines indicated in FIG. 5A and 5B. When $E_R$=3.3V, $V_C$'s are precharged to 3.3V and the polysilicon bit lines (312) are precharged to 1.4V. After $E_R$=0 and Vin goes to high, $C_{data}$ starts to discharge and $V_B$ as indicated in FIG. 3 is charging. The charging and discharging curves for the node $V_B$ and $V_C$ in every circuit block are shown in FIG. 5A and 5B. $V_B$ and $V_C$ of the first circuit block are denoted as $V_{B1}$ and $V_{C1}$; those of the last block are denoted as $V_{B10}$ and $V_{C10}$. In FIG. 5C, the left most rising edge is Vin which is the input $W_{LI}$ of the first circuit block. The 10 rising edges after Vin are $W_{LO}$'S of the 10 circuit blocks. The last one is Vout. The timing difference between Vin and Vout is the total delay.

Finally, the delay to read a logic "1" operation of a 1-bit DRAM cell is just 1/10 of the total delay minus the delay caused for any given initial "high" voltages on $C_{data}$ and initial voltages on the polysilicon bit line (312), wherein "high" means the reasonable logic "1" level. In addition, if the delay of the inverter pair (35) is considered, they can be estimated by SPICE simulations and deducted from the total delay time. Actually, it is expected that the delay of the inverter pair (35) should be very small compared with the total delay. Therefore, the measured delay to read a logic "1" operation of a 1-bit DRAM cell should be very precise.

The similar circuit can also be applied to measure the delay of a logic "0" read operation for a 1-bit DRAM cell. The only difference is adding one more inverter between the inverter pair (35) in every 1-bit circuit block (14) and 1-bit/output circuit block (15). Therefore, the inverter pair (35) becomes an inverter triple. The adjustable voltage $V_A$ is still on the first of the three inverters.

Although the present invention has been explained in relation to its preferred embodiment, it is to be understood that many other possible modifications and variations can be made without departing from the spirit and scope of the invention as hereinafter claimed.

What is claimed is:

1. A circuit for measuring the read operation delay on DRAM bit lines, comprising:
   a plurality of 1-bit circuit blocks connected in series, each including:
      a 1-bit DRAM cell having a data capacitor, a switch transistor and a bit line, said data capacitor being connected to one end of said bit line via said switch transistor, said switch transistor having a gate connected to a word line terminal for controlling the switch operation thereof;
      a first transmission gate having a first initial voltage input terminal and an output connected to said 1-bit DRAM cell for setting an initial voltage in said data capacitor;
      a second transmission gate having a second initial voltage input terminal and an output connected to said 1-bit DRAM cell for setting an initial voltage on said bit line;
      an inverter pair having an input and an output, said input being connected to the other end of said bit line, said inverter pair being constituted, of two inverters;
      a third transmission gate having an input connected to ground and an output connected to the output of said inverter pair to make sure the output of said inverter to be grounded initially; and
      a control terminal connected to said first, second and third transmission gates for controlling the transmission operations thereof,
         wherein the output of said inverter pair of each 1-bit circuit block is connected to the word line terminal of next 1-bit circuit block and said word line terminal of the first one of said plurality of 1-bit circuit blocks is provided as a signal input terminal of said circuit structure; and
   a 1-bit/output circuit block connected to the last one of said plurality of 1-bit circuit blocks, including:
      a 1-bit DRAM cell having a data capacitor, a switch transistor and a bit line, said data capacitor being connected to one end of said bit line via said switch transistor, said switch transistor having a gate connected to a word line terminal for controlling the switch operation thereof;
      a first transmission gate having a first initial voltage input terminal and an output connected to said 1-bit DRAM cell for setting an initial voltage in said data capacitor;
      a second transmission gate having a second initial voltage input terminal and an output connected to said 1-bit DRAM cell for setting an initial voltage on said bit line;
      an inverter pair having an input and an output, said input being connected to the other end of said bit line, said inverter pair being constituted of two inverters, each having two transistors whose channel widths can be enlarged to enhance the driving capability, and be adjusted for predetermined switching voltages of said inverter pair; and
      a control terminal connected to said first, second and third transmission gates for controlling the transmission operations thereof;
         wherein the word line terminal of said 1-bit/output circuit block is connected to the output of the last one of said plurality of 1-bit circuit blocks and the output of said inverter pair of said 1-bit/output circuit block is provided as a signal output terminal of said circuit structure.

2. The circuit for measuring the read operation delay on DRAM bit lines as claimed in claim 1, wherein an adjustable supplied voltage is provided to the inverter whose input is connected to said bit line in each one of the inverter pairs of said plurality of 1-bit circuit blocks and said 1-bit/output circuit block thereby said inverter being provided with an adjustable switching voltage.

3. The circuit for measuring the read operation delay on DRAM bit lines as claimed in claim 1, wherein each one of the bit lines of said plurality of 1-bit circuit blocks and said 1-bit/output circuit block is connected with a plurality of dummy DRAM cells.

4. In a circuit for measuring the read operation delay on DRAM bit lines comprising a plurality of 1-bit circuit blocks connected in series and a 1-bit/output circuit block connected to the last one of said plurality of 1-bit circuit blocks, each of said plurality of 1-bit circuit blocks including a 1-bit DRAM cell having a data capacitor and a bit line, a first transmission gate, a second transmission gate, an inverter pair, a third transmission gate and a control terminal, wherein the output of said inverter pair of each of said plurality of 1-bit circuit block is connected to a word line terminal of the next 1-bit circuit block, and a word line terminal of the first one of said plurality of 1-bit circuit blocks is provided as a signal input terminal of said circuit, and said 1-bit/output circuit block including a bit DRAM cell having a data capacitor and a bit line, a first transmission gate, a second transmission gate, an inverter pair and a control terminal, wherein a word line terminal of said 1-bit/output circuit block is connected to the output of the last one of said plurality of 1-bit circuit blocks and the output of said inverter pair of said 1-bit/output circuit block is provided as a signal output terminal of said circuit, and wherein an adjustable supplied voltage is provided to an inverter whose input is connected to said bit line in each of the inverter pairs of said plurality of 1-bit circuit blocks and said 1-bit/output circuit block, thereby said inverter being provided with an adjustable switching voltage, a method for measuring the read operation delay on DRAM bit lines comprising the steps of:
   determining a supplied voltage to the inverter whose input is connected to said bit line in each of the inverter pairs of said plurality of 1-bit circuit blocks and said 1-bit/ output circuit block;
   estimating a delay caused by each of the inverter pairs in said read operation by utilizing Simulation Program with Integrated-Circuit Emphasis (SPICE) simulation;
   applying a first square wave to said signal input terminal and a second square wave to each of the control terminals of said plurality of 1-bit circuit blocks and said 1-bit/output circuit block, said first square wave having a high level duration longer than the total delay caused said plurality of 1-bit circuit blocks and said 1-bit/output circuit block, said second square wave being substantially opposite states to said first square wave, said second square wave having a high level duration for charging each of said data capacitors and energizing each of said bit lines to stable voltage levels;

detecting an output waveform on said signal output terminal;

comparing said first square wave with said output waveform to obtain a total delay time between the two;

calculating a delay time for one 1-bit DRAM cell by dividing said total delay time by the total number of said 1-bit circuit blocks and said 1-bit/output circuit block in said circuit and subtracting it from the delay caused by each of the inverter pairs.

5. The method for measuring the read operation delay on DRAM bit lines as claimed in claim 4, wherein said data capacitor and said bit line are respectively pre-charged to an initial voltage level, the initial voltage level of said data capacitor being higher than that of said bit line, the initial voltage level of said bit line being lower than the switching voltage of said inverter.

6. A circuit for measuring the read operation delay on DRAM bit lines, comprising:

a plurality of 1-bit circuit blocks connected in series, each including:

a 1-bit DRAM cell having a data capacitor, a switch transistor and a bit line, said data capacitor being connected to one end of said bit line via said switch transistor, said switch transistor having a gate connected to a word line terminal for controlling the switch operation thereof;

a first transmission gate having a first initial voltage input terminal and an output connected to said 1-bit DRAM cell for setting an initial voltage in said data capacitor;

a second transmission gate having a second initial voltage input terminal and an output connected to said 1-bit DRAM cell for setting an initial voltage on said bit line;

an inverter triple having an input and an output, said input being connected to the other end of said bit line, said inverter triple being constituted by three inverters;

a third transmission gate having an input connected to ground and an output connected to the output of said inverter triple to make sure the output of said inverter triple to be grounded initially; and a control terminal connected to said first, second and third transmission gates for controlling the transmission operations thereof, wherein the output of said inverter triple of each 1-bit circuit block is connected to the word line terminal of next 1-bit circuit block and said word line terminal of the first one of said plurality of 1-bit circuit blocks is provided as a signal input terminal of said circuit structure; and a 1-bit/output circuit block connected to the last one of said plurality of 1-bit circuit blocks, including:

a 1-bit DRAM cell having a data capacitor, a switch transistor and a bit-line, said data capacitor being connected to one end of said bit line via said switch transistor, said switch transistor having a gate connected to a word line terminal for controlling the switch operation thereof;

a first transmission gate having a first initial voltage input terminal and an output connected to said 1-bit DRAM cell for setting an initial voltage in said data capacitor;

a second transmission gate having a second initial voltage input terminal and an output connected to said 1-bit DRAM cell for setting an initial voltage on said bit line;

an inverter triple having an input and an output, said input being connected to the other end of said bit line, said inverter triple being constituted by three inverters, each having two transistors whose channel widths can be enlarged to enhance the driving capability, and be adjusted for predetermined switching voltages of said inverter triple; and a control terminal connected to said first, second and third transmission gates for controlling the transmission operations thereof;

wherein the word line terminal of said 1-bit/output circuit block is connected to the output of the last one of said plurality of 1-bit circuit blocks and the output of said inverter triple of said 1-bit/output circuit block is provided as a signal output terminal of said circuit structure.

7. The circuit for measuring the read operation delay on DRAM bit lines as claimed in claim 6, wherein an adjustable supplied voltage is provided to the inverter whose input is connected to said bit line in each one of the inverter triple of said plurality of 1-bit circuit blocks and said 1-bit/output circuit block thereby said inverter being provided with an adjustable switching voltage.

8. The circuit for measuring the read operation delay on DRAM bit lines as claimed in claim 6, wherein each one of the bit lines of said plurality of 1-bit circuit blocks and said 1-bit/output circuit block is connected with a plurality of dummy DRAM cells.

9. In a circuit for measuring the read operation delay on DRAM bit lines comprising a plurality of 1-bit circuit blocks connected in series and a 1-bit/output circuit block connected to the last one of said plurality of 1-bit circuit blocks, each of said plurality of 1-bit circuit blocks including a 1-bit DRAM cell having a data capacitor and a bit line, a first transmission gate, a second transmission gate, an inverter triple, a third transmission gate and a control terminal, wherein the output of said inverter triple of each of said plurality of 1-bit circuit blocks is connected to a word line terminal of the next 1-bit circuit block, and said word line terminal of the first one of said plurality of 1-bit circuit blocks is provided as a signal input terminal of said circuit, said 1-bit/output circuit block including a 1-bit DRAM cell having a data capacitor and a bit line, a first transmission gate, a second transmission gate, an inverter triple and a control terminal, wherein a word line terminal of said 1-bit/output circuit block is connected to the output of the last one of said plurality of 1-bit circuit blocks, and the output of said inverter triple of said 1-bit/output circuit block is provided as a signal output terminal of said circuit, and wherein an adjustable supplied voltage is provided to an inverter whose input is connected to said bit line in each of the inverter triples of said plurality of 1-bit circuit blocks and said 1-bit/output circuit block thereby said inverter being provided with an adjustable switching voltage, a method for measuring the read operation delay on DRAM bit lines comprising the steps of:

determining a supplied voltage to the inverter whose input is connected to said bit line in each of the inverter triples of said plurality of 1-bit circuit blocks and said 1-bit/output circuit block;

estimating a delay caused by each of the inverter triples in said read operation by utilizing SPICE simulation;

applying a first square wave to said signal input terminal and a second square wave to each of the control terminals of said plurality of 1-bit circuit blocks and said 1-bit/output circuit block, said first square wave having a high level duration longer than total delay caused by said plurality of 1-bit circuit blocks and said 1-bit/output circuit block, said second square wave being substantially opposite states to said first square wave, said second square wave having a high level duration for charging each of said data capacitors and energizing each of said bit lines to stable voltage levels;

detecting an output waveform on said signal output terminal;

comparing said first square wave with said output waveform to obtain a total delay time between the two;

calculating a delay time for one 1-bit DRAM cell by dividing said total delay time by the total number of said 1-bit circuit blocks and said 1-bit/output circuit block in said circuit structure and subtracting it from the delay caused by each of the inverter triples.

10. The method for measuring the read operation delay on DRAM bit lines as claimed in claim 9, wherein said data capacitor and said bit line are respectively pre-charged to an initial voltage level, the initial voltage level of said data capacitor being lower than that of said bit line, the initial voltage level of said bit line being higher than the switching voltage of said inverter.

* * * * *